United States Patent [19]

Langone et al.

[11] Patent Number: 4,743,842
[45] Date of Patent: May 10, 1988

[54] TRI-STATE CIRCUIT TESTER

[75] Inventors: Joseph A. Langone, Greenlawn; Michael Ugenti, Melville, both of N.Y.

[73] Assignee: Grumman Aerospace Corporation, Bethpage, N.Y.

[21] Appl. No.: 24,486

[22] Filed: Mar. 11, 1987

[51] Int. Cl.$^4$ .................. G01N 27/42; H03K 5/153
[52] U.S. Cl. .................... 324/73 R; 324/133; 324/433; 307/360; 307/473
[58] Field of Search ............ 324/73 R, 133, 425, 324/432, 433; 340/661, 660, 662, 715, 753, 754; 307/358, 360, 473

[56] References Cited

U.S. PATENT DOCUMENTS

| | | | |
|---|---|---|---|
| 2,902,600 | 9/1959 | Coffin | 328/205 |
| 3,268,743 | 8/1966 | Nourney | 328/109 |
| 3,461,390 | 8/1969 | Mack | 328/109 |
| 3,492,496 | 1/1970 | Callan | 307/473 |
| 3,601,631 | 8/1971 | Miller | 307/209 |
| 3,866,147 | 2/1975 | de Couvreur et al. | 332/11 R X |
| 4,321,543 | 3/1982 | Tuska | 324/433 X |
| 4,435,658 | 3/1984 | Murray et al. | 307/530 X |
| 4,480,200 | 10/1984 | Tan et al. | 307/360 X |

FOREIGN PATENT DOCUMENTS 524582 5/1956 Canada .

OTHER PUBLICATIONS

IBM Technical Disclosure Bulletin, vol. 24, No. 12, May 1982, pp. 6492–6493.
IBM Technical Disclosure Bulletin, vol. 19, No. 5, Oct. 1976, pp. 1898–1899.
IBM Technical Disclosure Bulletin, vol. 23, No. 9, Feb. 1981, pp. 4156–4158.
IBM Technical Disclosure Bulletin, vol. 12, No. 6, Nov. 1969, pp. 828–829.
IBM Technical Disclosure Bulletin, vol. 8, No. 4, Sep. 1965, pp. 661–662.
Western Electric, Technical Digest No. 40, Oct. 1975, pp. 13–15.

Primary Examiner—Ernest F. Karlsen
Assistant Examiner—Vinh P. Nguyen
Attorney, Agent, or Firm—Pollock, VandeSande & Priddy

[57] ABSTRACT

A testing circuit is capable of testing digital circuits, such as gates, in logic 1, logic 0 and Hi-Z conditions. To accomplish this end two comparators are connected to the output of the digital circuit undergoing test while second inputs of both comparators are respectively connected to different reference voltages. By comparing the voltage level at the output of the digital circuit undergoing test with programmable reference voltages, unique truth tables are established for an operative digital circuit undergoing test.

5 Claims, 1 Drawing Sheet

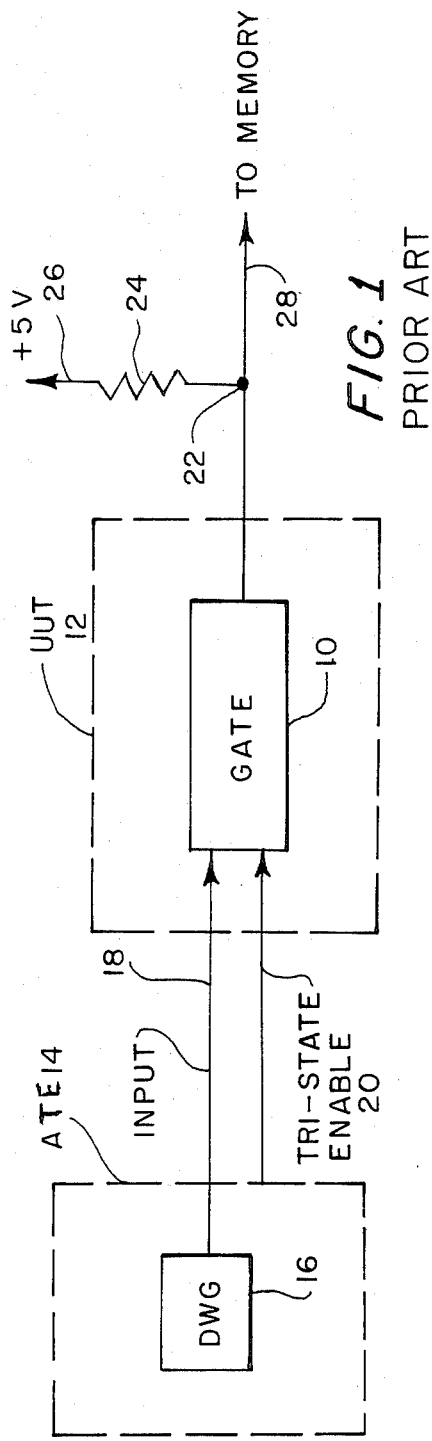
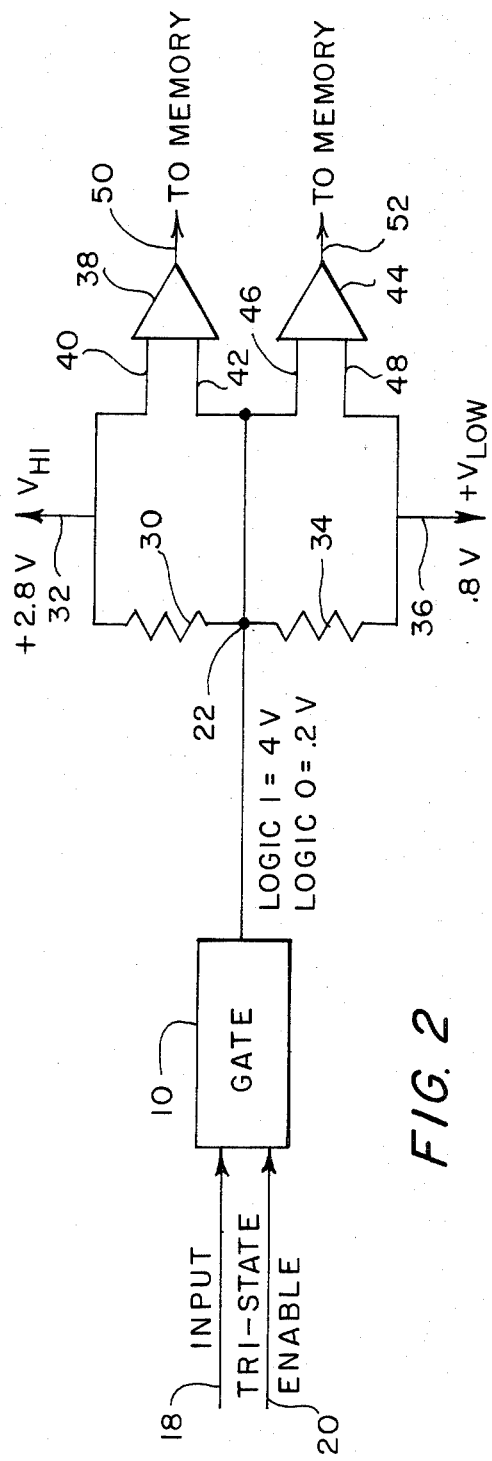

TRI-STATE CIRCUIT TESTER

FIELD OF THE INVENTION

The present invention relates to circuit testing devices, and more particularly to means for testing a circuit, such as a gate, in three states of operation, including the tri-state or Hi-Z condition.

BACKGROUND OF THE INVENTION

Tri-state operation is becoming increasingly common in electronic circuit design. Such circuits operate in one of three possible states: logic 1, logic 0 and a high impedance state known as the tri-state or Hi-Z condition. It is often necessary to test circuits, such as gates, to determine whether they are correctly operating in the three possible states indicated. Fast and accurate checking of many tri-state components are particularly necessary in automated test equipment (ATE) which typically tests a large number of gates in a unit undergoing test (UUT). An ATE is usually programmed to generate the necessary levels to complete three-state testing of gates or other digital circuits within the UUT.

BRIEF DESCRIPTION OF THE PRIOR ART

FIG. 1 indicates a technique which has been traditionally used in testing the tri-state condition of a device, such as a gate 10. A UUT 12 would include many such gates and the various digital levels necessary to check the gate are generally produced by an ATE 14. Specifically, within the ATE are a large number of digital word generators (DWG) such as 16. Each such DWG will generate the signals to a particular gate such as 10 within a UUT.

According to the prior art, the DWG 16 generates a signal that is connected to the input 18 of gate 10. This input will include a pattern of logic 1 and logic 0 levels. If gate 10 is operating correctly, the same pattern of logic levels will occur at output 28. The output 28 may be connected to a memory. By comparing the stored memory word with the input word from the DWG 16, a favorable test of gate 10 will result when there is a match. If there is not a match, the gate 10 may be determined as being defective.

In order to extend the testing of gate 10 to a tri-state condition, an enable signal is generated by the ATE 14 and is input to gate 10. This should cause the output of gate 10 to exhibit a high output impedance. Consequently, the DC bias voltage at point 26 is imposed at junction point 22 since no current will flow through resistor 24 with a high output impedance at gate 10. For example, if the bias voltage at point 26 is five volts, the same five volts should be present at junction point 22. However, a problem with the prior art approach would appear if the output of the gate were "stuck" at a logic 1 condition, in which case the voltage at junction point 22 would erroneously appear as though the gate were in a proper tri-state condition. Accordingly, the prior art approach is unable to avoid a particular ambiguity which can arise when testing a large number of gates.

BRIEF DESCRIPTION OF THE PRESENT INVENTION

The present invention is directed to a testing circuit which avoids the ambiguous testing of the prior art approach. Distinct conditions are present at the output of the testing circuit for logic 1, logic 0 and the tri-state condition.

Further, the present invention is adaptable so that reference voltages are programmable by an ATE so that different families of gates may be accommodated.

BRIEF DESCRIPTION OF THE FIGURES

The above-mentioned objects and advantages of the present invention will be more clearly understood when considered in conjunction with the accompanying drawings, in which:

FIG. 1 is a basic block diagram of a prior art circuit; and

FIG. 2 is a basic block diagram of the present invention for testing the three operational states of a digital circuit.

DETAILED DESCRIPTION OF THE INVENTION

The gate 10, input 18 and enable input 20 shown in FIG. 2 are identical with those previously discussed in connection with FIG. 1.

The departure of the present invention from the prior art circuit shown in FIG. 1 is the inclusion of two reference DC bias voltages at points 32 and 36, which are respectively connected to junction point 22 by matching resistors 30 and 34. Assuming the illustrative logic voltages of logic 1=4 v and logic 0=0.2 v; and the illustrative DC reference bias voltages of 2.8 v and 0.8 v as high and low reference voltages, respectively, unique comparisons will result at comparators 38 and 44 for each of the three logic states of gate operation. Comparator 38 has a first input 40 connected to the DC bias voltage at point 32 and a second input 42 connected to junction point 22. Similarly, the comparator 44 has a first input 46 connected to junction point 22 while a second input 48 is connected to the bias voltage point 36.

In operation of the inventive circuit shown in FIG. 2, first consider circuit operation if the input 18 presents a logic 1 which will be assumed to present four volts at the output of gate 10. Comparator 38 will generate a logic 1 at output 50 when the input 40 is less than the input at 42 so that output 50 will carry a proper logic 1 level. Similarly, the voltage at input 48 of comparator 44 is greater than that at input 46 so that the output 52 of comparator 44 also carries a logic 1 voltage level. With the comparator outputs 50 and 52 both evidencing a logic 1 level, it has been determined that the gate 10 successfully tested the logic level 1 condition.

In the illustration where the input 18 presents a logic 0 condition, a 0.2 v output appears at gate 10. The comparators 38 and 44 will be seen to generate logic 0's at both outputs 50 and 52. This is due to the fact that the first inputs 40 and 48 of the respective comparators 38 and 44 carry voltages which are greater than the voltages at their second inputs 42 and 46.

Now considering the testing in the tri-state condition, the output impedance of gate 10 will assume a high output impedance when a tri-state condition is present. As a result, the voltage at junction point 22 will be midway between the illustrative 2.8 v and 0.8 v. In this illustration, this value will be 1.8 v. With this voltage level present at the second inputs 42 and 46 of respective comparators 38 and 44, comparator 38 will generate a logic 0 while comparator 44 will generate a logic 1. This is due to the fact that the first input 40 of comparator 38 will have a higher voltage present thereat than at the second input 42. On the other hand, the first input 46 of comparator 44 will have a higher voltage present thereat than at the second input 48. The resulting generation of a logic 0 on output 50 and a logic 1 on output 52 successfully completes the tri-state test of gate 10. As in the case of FIG. 1, the outputs 50 and 52 may be connected to memory to store the outputs as the inputs are varied through the three logic state conditions. If the anticipated outputs are stored, gate 10 is determined to be totally operational through all three logic operating states.

Of course, it will be appreciated that the particular voltage values discussed are simply chosen by way of example only. From the above discussion, it will be seen that the present invention offers the capability of rapidly and accurately testing digital circuits, such as gates, in logic 1, logic 0 and tri-state conditions.

It should be understood that the invention is not limited to the exact details of construction shown and described herein for obvious modifications will occur to persons skilled in the art.

I claim:

1. A circuit for testing a tri-state digital device having a signal input for logic 1 and logic 0 levels, the device also having a tri-state enable input, the testing circuit comprising:
   first and second reference voltage points;
   voltage dividing means having a center contact connected to an output of the device and further having outer contacts connected to respective reference voltage points;
   first and second comparators each having a first input connected to a corresponding reference voltage point and a second input connected to the center point; and
   individual terminal means at the outputs of the comparators which carry
      logic 0 levels at both terminals when a logic 0 is present at the signal input,
      logic 1 levels at both terminals when a logic 1 is present at the signal input,
      logic 0 at one terminal and logic 1 at the other terminal when an enable signal is present at the tri-state enable input.

2. The structure set forth in claim 1 wherein the voltage dividing means comprises a pair of matching resistors.

3. The structure set forth in claim 1 wherein the first reference voltage is maintained at an analog value less than the analog value of the logic 1 level; and the second reference voltage is maintained at an analog value greater than the analog value of a logic 0 level.

4. The structure set forth in claim 2 wherein the first reference voltage is maintained at an analog value less than the analog value of the logic 1 level; and the second reference voltage is maintained at an analog value greater than the analog value of a logic 0 level.

5. A method for testing a tri-state digital device having a signal input for logic 1 and logic 0 levels, the device also having a tri-state enable input, the method comprising the following steps:
   making first and second reference voltages available at separate points;
   dividing the voltage between the points so that a center reference voltage point is obtained;
   connecting the output of a digital device to the center reference voltage point;
   at a first instant, making a first comparison between the first reference voltage and the voltage of a first logic level present at the center reference voltage point;
   at the first instant, making a second comparison between the second reference voltage and the voltage of a first logic level present at the center reference voltage point;
   determining whether the device operates satisfactorily with the first logic levels by comparing the first and second comparisons during the first instant wherein a match therebetween indicates satisfactory operation;
   at the second instant, making a first comparison between the first reference voltage and the voltage of a second logic level present at the center reference voltage point;
   at the second instant, making a second comparison between the second reference voltage and the voltage of a second logic level present at the center reference voltage point;
   determining whether the device operates satisfactorily with the second logic level by comparing the first and second comparisons during the second instant wherein a match therebetween indicates satisfactory operation;
   at a third instant, providing the device with a tri-state enable command and simultaneously making a first comparison between the first reference voltage and a reference voltage at the center reference voltage point;
   at the third instant, making a second comparison between the second reference voltage and the reference voltage present at the center reference voltage point; and
   determining during the third instant whether the device operates satisfactorily in a tri-state mode by comparing the first and second comparisons whereby a mismatch of these comparisons indicates satisfactory tri-state operation.

* * * * *

UNITED STATES PATENT AND TRADEMARK OFFICE
CERTIFICATE OF CORRECTION

PATENT NO. : 4,743,842

DATED : May 10, 1988

INVENTOR(S) : Joseph A. Langone, et al.

It is certified that error appears in the above-identified patent and that said Letters Patent is hereby corrected as shown below:

Column 2, line 46, change "greater" to --lower--.

Signed and Sealed this

Twenty-seventh Day of September, 1988

Attest:

DONALD J. QUIGG

Attesting Officer

Commissioner of Patents and Trademarks